United States Patent
Okamoto

(10) Patent No.: US 12,424,264 B2
(45) Date of Patent: Sep. 23, 2025

(54) STACKED MEMORY WITH A TIMING ADJUSTMENT FUNCTION

(71) Applicant: Powerchip Semiconductor Manufacturing Corporation, Hsinchu (TW)

(72) Inventor: Takeo Okamoto, Osaka (JP)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 226 days.

(21) Appl. No.: 18/183,177

(22) Filed: Mar. 14, 2023

(65) Prior Publication Data
US 2024/0312511 A1    Sep. 19, 2024

(51) Int. Cl.
| | | |
|---|---|---|
| *G11C 11/4076* | (2006.01) | |
| *G11C 5/02* | (2006.01) | |
| *G11C 5/06* | (2006.01) | |
| *G11C 7/22* | (2006.01) | |
| *H10B 80/00* | (2023.01) | |

(52) U.S. Cl.
CPC .......... *G11C 11/4076* (2013.01); *H10B 80/00* (2023.02)

(58) Field of Classification Search
CPC ....... G11C 11/4076; G11C 5/02; G11C 5/063; G11C 7/22; H10B 80/00
See application file for complete search history.

(56) References Cited

U.S. PATENT DOCUMENTS

| | | |
|---|---|---|
| 10,770,122 B2 | 9/2020 | Katoch et al. |
| 2014/0337570 A1 | 11/2014 | LaBerge et al. |
| 2015/0188732 A1 | 7/2015 | Muljono et al. |
| 2021/0263660 A1 | 8/2021 | Pilolli et al. |
| 2021/0319844 A1 | 10/2021 | Shi et al. |
| 2022/0122645 A1 | 4/2022 | Mori |
| 2022/0300438 A1* | 9/2022 | Ootomo .............. G06F 13/1684 |

FOREIGN PATENT DOCUMENTS

TW    201027556    7/2010

OTHER PUBLICATIONS

"Office Action of Taiwan Counterpart Application", issued on Apr. 3, 2024, p. 1-p. 5.

* cited by examiner

*Primary Examiner* — Son T Dinh
*Assistant Examiner* — Elizabeth Rose Agger
(74) *Attorney, Agent, or Firm* — JCIPRNET

(57) ABSTRACT

A stacked memory with a timing adjustment function is provided, including a logic chip; a memory chip coupled to the logic chip in a face-to-face manner and including plural memory tiles; plural timing adjustment devices, respectively provided in each memory tile, wherein for each memory tile, each timing adjustment device further includes a first timing adjustment device that is configured to adjust setup times and hold times for a command and an address with respect to an edge of a clock signal and a second timing adjustment device that is configured to adjust a setup time and a hold time for input data with respect to the edge of the clock signal.

6 Claims, 9 Drawing Sheets

STACKED MEMORY WITH A TIMING ADJUSTMENT FUNCTION

BACKGROUND

Technical Field

The disclosure relates to a timing adjustment device and method for a stacked semiconductor device.

Description of Related Art

The stacked semiconductor device including logic chips and memory chips is available by wafer-on-wafer (WoW) technology. There is a configuration that a single logic chip and a memory chip (including M×N memory tiles, M and N are integers) form a stacked semiconductor device. The size of the single logic is equal to the size of the memory chip (M×N memory tiles). The memory chips are fabricated and arranged on a wafer like as tiles.

In such structure, when the logic chip controls a large number of memory tiles (all memory tiles have the same characteristic), it becomes difficult to design and construct a whole product.

FIG. 1A illustrates an exemplary configuration for describing occurrence of skew issue at the input side of a memory device. In FIG. 1A, the stacked DRAM device includes a DRAM chip including 16 DRAM tiles 1 and a logic chip including one logic memory controller 2, in which the logic chip is stacked on the memory chip in a face-to-face bonding manner. The size of the logic chip is equal to the size of the memory chip. The logic memory controller 2 controls all DRAM tiles 1. The logic memory controller 2 provides the command CMD, the address and the data to be written to the flip-flops 3, 3' of each DRAM tile 1 through the command line, address line and data line. In addition, the logic memory controller 2 also provides the clock signal CLK to the flip-flops 3, 3' of each DRAM tile 1 through the clock signal line.

As shown, since there is only one logic memory controller 2, the signal paths for the command CMD, address ADD, data DIN and clock signal CLK are different from the logic memory controller 2 to each of the DRAM tiles 1. In general, it requires that the characteristic of each DRAM tile 1 is the same, such that the setup time and the holing time for the command/address and the data for each DRAM tile 1 are the same. However, for the configuration having one logic memory controller 2, it is very difficult to design. Similarly, as shown in FIG. 1B, the output for each DRAM tile 1 has the same issue. For the configuration having one logic memory controller 2, it is difficult to make the data output with respect to the clock signal CLK have the same output delay time and skew time.

In such a situation, one needs to design the wire tree-structure of signal lines to form the same wiring length from the logic memory controller 2 to each DRAM tile 1. However, this complicates the design. In addition, using a wire-tree structure may increase the number of logic memory controller 2 needed, and this will increase the size of the logic chip.

As a result, the design for such memory structure becomes complicated to design and difficult to construct a whole product, when the logic chip controls a large number of DRAM tiles.

SUMMARY

In view of above, the disclosure provides a stacked memory with a timing adjustment function. The stacked memory comprises a logic chip, a memory chip and a plurality of timing adjustment devices. The memory chip is coupled to the logic chip in a face-to-face manner and includes a plurality of memory tiles. The plurality of timing adjustment devices is respectively provided in each of the memory tiles, wherein for each of the plurality of memory tiles, each of the plurality of timing adjustment devices further comprises a first timing adjustment device that is configured to adjust setup times and hold times for a command and an address with respect to an edge of a clock signal and a second timing adjustment device that is configured to adjust a setup time and a hold time for input data with respect to the edge of the clock signal.

According to one embodiment of the disclosure, in the stacked memory, the first timing adjustment device is provided in a memory control circuit of each of the plurality of memory tiles and the second timing adjustment device is provided in a data input part of a data input/output circuit of each of the plurality of memory tiles.

According to one embodiment of the disclosure, in the stacked memory, each of the first and the second timing adjustment devices further comprises a selector and a flip flop. The selector has an output and a plurality of input paths for receiving the command, the address or the input data, and is configured to select one of the input paths in response to a selection signal, wherein the plurality of the input paths is configured to respectively provide different shift amounts to adjust the setup times and the hold times for the command and the address and to adjust the setup time and the hold time for the input data. The flip-flop has a first input that is configured to receive the output of the selector, a second input that is configured to receive the clock signal, and an output configured to output the command, the address or the input data that is shifted with respect to the edge of the clock signal to a memory array of each of the plurality of memory tiles.

According to one embodiment of the disclosure, in the stacked memory, alternatively, each of the first and the second timing adjustment devices further comprises a selector and a flip flop. The selector has a plurality of input paths that are configured to receive the clock signal and an output, and is configured to select one of the input paths in response to a selection signal, wherein the plurality of the input paths is configured to respectively provide different shift amounts for the edge of the clock signal. The flip-flop has a first input that is configured to receive the command, the address or the input data, a second input that is configured to receive the output of the selector, and an output configured to output the command, the address or the input data to a memory array of each of the plurality of memory tiles.

According to one embodiment of the disclosure, in the stacked memory, the selection signal is set by a command from a mode register of each of the memory tile, or is set by a one-time programmable device or a laser fuse.

According to one embodiment of the disclosure, in the stacked memory, the flip-flop is a D-type flip flop. According to one embodiment of the disclosure, in the stacked memory, the memory chip is a DRAM chip.

According to another embodiment of the disclosure, the disclosure provides a stacked memory with a timing adjustment function. The stacked memory comprises a logic chip, a memory chip and a plurality of timing adjustment devices. The memory chip is coupled to the logic chip in a face-to-face manner and includes a plurality of memory tiles. The plurality of timing adjustment devices is respectively provided in each of the memory tiles, and each of the plurality of timing adjustment devices is configured to adjust an output delay time of a data strobe signal with respect to an edge of a clock signal and a skew time of output data with respect to an adjusted data strobe signal.

According to the another embodiment of the disclosure, in the stacked memory, the timing adjustment device is provided in a data output part of a data input/output circuit of each of the plurality of memory tiles.

According to the another embodiment of the disclosure, in the stacked memory, each of the timing adjustment devices further comprises a flip flop and a selector. The flip flop has a first input that is configured to receive internal output data stored in a memory array of each of the plurality of memory tiles, a second input that is configured to receive the clock signal, and an output that is configured to output the internal output data. The selector has an output and a plurality of input paths for receiving internal output data, and configured to select one of the input paths in response to a selection signal, wherein the plurality of the input paths is configured to respectively provide different shift amounts to adjust the output delay time and the skew time of the output data.

According to the another embodiment of the disclosure, in the stacked memory, the selection signal is set by a command from a mode register of each of the memory tile, or is set by an one-time programmable device or a laser fuse.

According to the another embodiment of the disclosure, in the stacked memory, the flip-flop is a D-type flip flop. According to one embodiment of the disclosure, in the stacked memory, the memory chip is a DRAM chip.

According to another embodiment of the disclosure, the disclosure provides a stacked memory with a timing adjustment function. The stacked memory comprises a logic chip and a memory chip. The logic chip is provided with a plurality of signal lines and a clock signal line that are connected to a logic memory controller of the logic chip. The memory chip is coupled to the logic chip in a face-to-face manner and includes a plurality of memory tiles, wherein each of the plurality of memory tiles is provided with a RDL wiring line and a clock signal. The RDL wiring line of each of the plurality of the memory tiles are connected to the plurality of signal lines of the logic chip and the clock signal of each of the plurality of the memory tiles is connected to the clock signal line of the logic chip. The wiring lengths of the plurality of RDL wiring lines are different to as to adjust setup times and hold times for a command, an address and an input data with respect to an edge of a clock signal.

According to the another embodiment of the disclosure, in the stacked memory, in a case that the memory tile is at a far side form the logic memory controller, the wiring length of the RDL wiring line is short, and in a case that the memory tile is at a near side form the logic memory controller, the wiring length of the RDL wiring line is long.

According to the another embodiment of the disclosure, in the stacked memory, same wiring lengths of the DRAM tiles are provided when the DRAM tiles have equal distance to the logic memory controller.

According to the another embodiment of the disclosure, in the stacked memory, the memory chip is a DRAM chip.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1B:
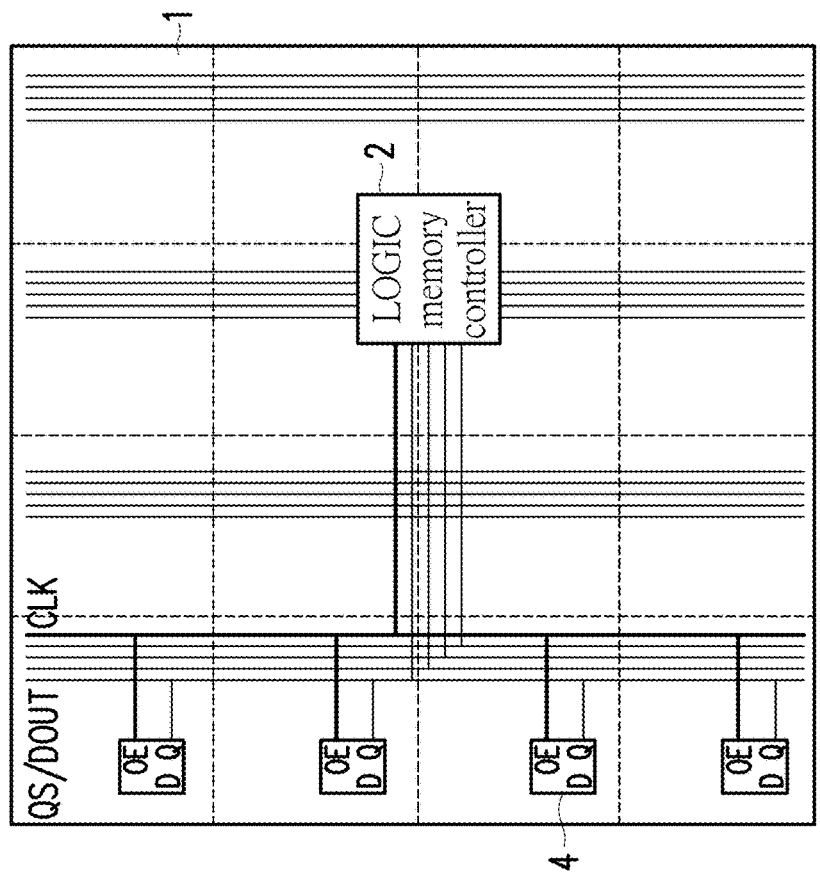
FIG. 1B illustrates an exemplary configuration for describing occurrence of skew issue at the output side of a memory device.
Figure 1A:
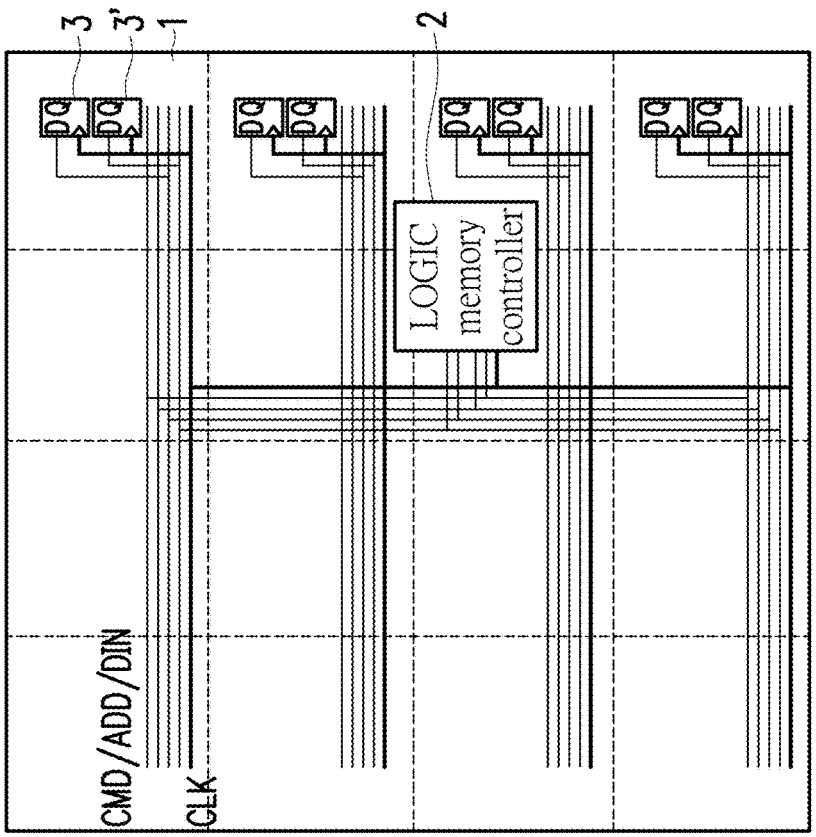
FIG. 1A illustrates an exemplary configuration for describing occurrence of skew issue at the input side of a memory device.
Figure 2:
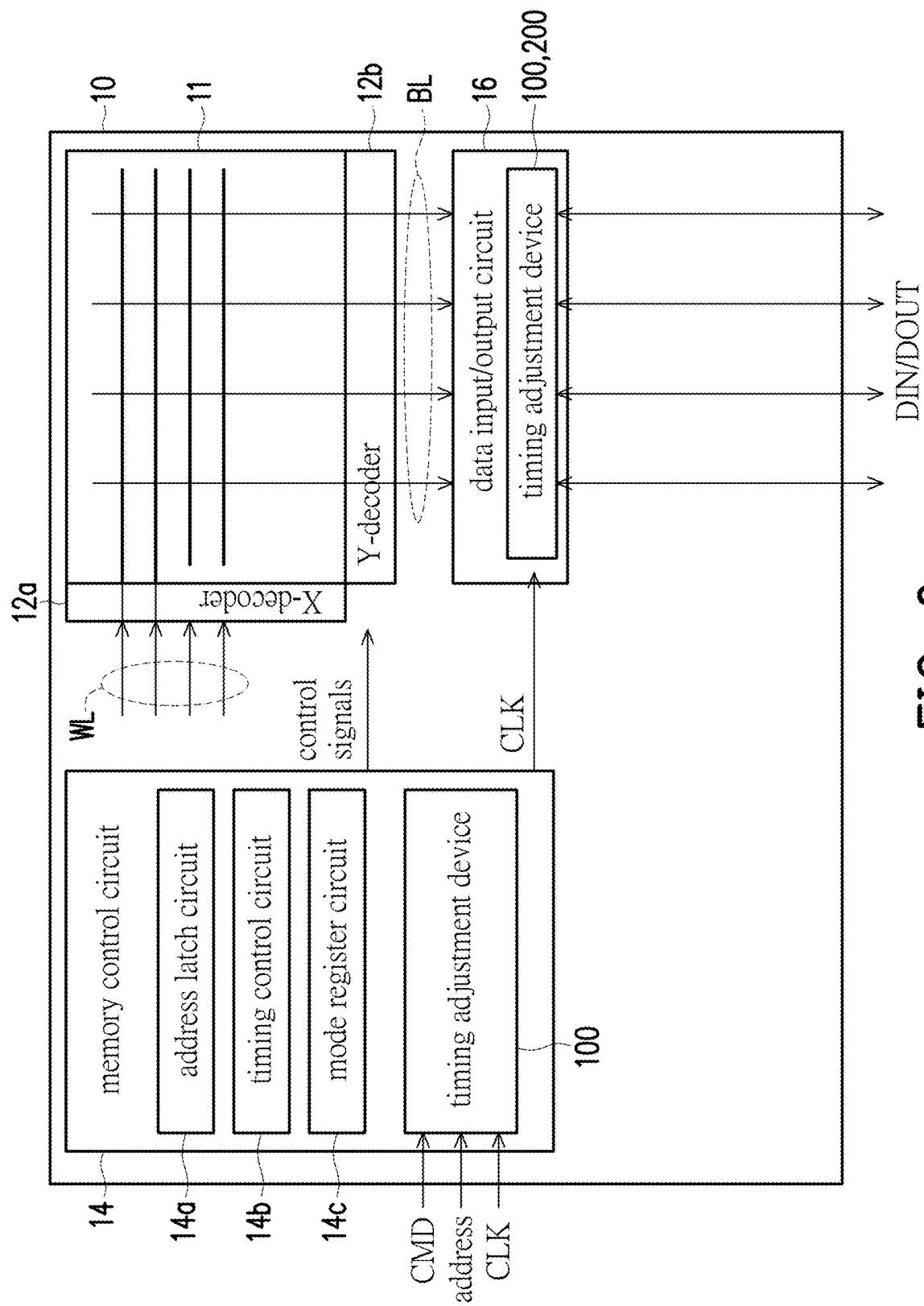
FIG. 2 illustrates an exemplary memory tile configuration according to one embodiment of the disclosure.

FIG. 2 illustrate an exemplary memory tile configuration according to one embodiment of the disclosure. The memory chip may comprises a plurality of memory tiles that is arranged in a M×N array configuration, wherein M and N are integrals. Each of the memory tiles is the same structure. In the following embodiment, a DRAM title is used as an example for descriptions. The DRAM tile 10 comprises a memory array 11, an X-decoder 12a, a y-decoder 12b, a memory control circuit 14 and a data input/output circuit 16. The memory array 11 comprise a plurality of word lines and a plurality of bit lines, and memory cells are respectively arranged at the intersection of the word lines WL and bit lines BL. The X-decoder 12a and the y-decoder 12b are used to specify a particularly memory cell for writing or reading.

In addition, the memory control circuit 14 or the control logic is used to control the operations of the DRAM tile 10. In an example, the memory control circuit 14 may comprise an address latch circuit (address latch) 14a, a timing control circuit (timing controller) 14b and a mode register circuit (mode register) 14c. The data input/output circuit 16 is used for data input (write) and data output (read) in response to a clock signal CLK, and may be implemented by an I/O buffer. For those skilled in this art, the memory control circuit 14 and the data input/output circuit 16 can be any suitable configuration for the DRAM tile, which are not particularly limited for implementing the disclosure.

According to the embodiment of the disclosure, the memory control circuit 14 may further comprise a timing adjustment device (first timing adjustment device) 100 for adjusting a shift amount of a command and address with respect to an edge (rising or falling edge) of the clock signal CLK. Also, the data input/output circuit 16 may further comprise a timing adjustment device 100 for the data input part (such as a data input buffer), so as to adjust a shift amount of input data with respect to the edge (rising or falling edge) of the clock signal CLK.

In addition, according to another embodiment of the disclosure, the data input/output circuit 16 may further comprise a timing adjustment device (second timing adjustment device) 200 for the data output part, so as to adjust a shift amount of output data with respect to the edge (rising or falling edge) of the clock signal CLK.

According to the embodiment, to facilitate a design of the stacked memory device, the disclosure provide a solution to adjust a setup/hold time characteristic with respect to the clock signal CLK for the input of DRAM tiles and to adjust an output delay time and a skew time with respect to the clock signal CLK for the output of DRAM tiles. The disclosure provides the timing adjustment 100 in the memory control circuit 14 and the data input part of the data input/output circuit 16 for adjusting the shift amount of the command, address and input data with respect to the edge of the clock signal CLK. Alternative, the disclosure provides the timing adjustment 200 in the data output part of the data input/output circuit 16 for adjusting the shift amount of the output data with respect to the edge of the clock signal CLK.

Figure 3A:
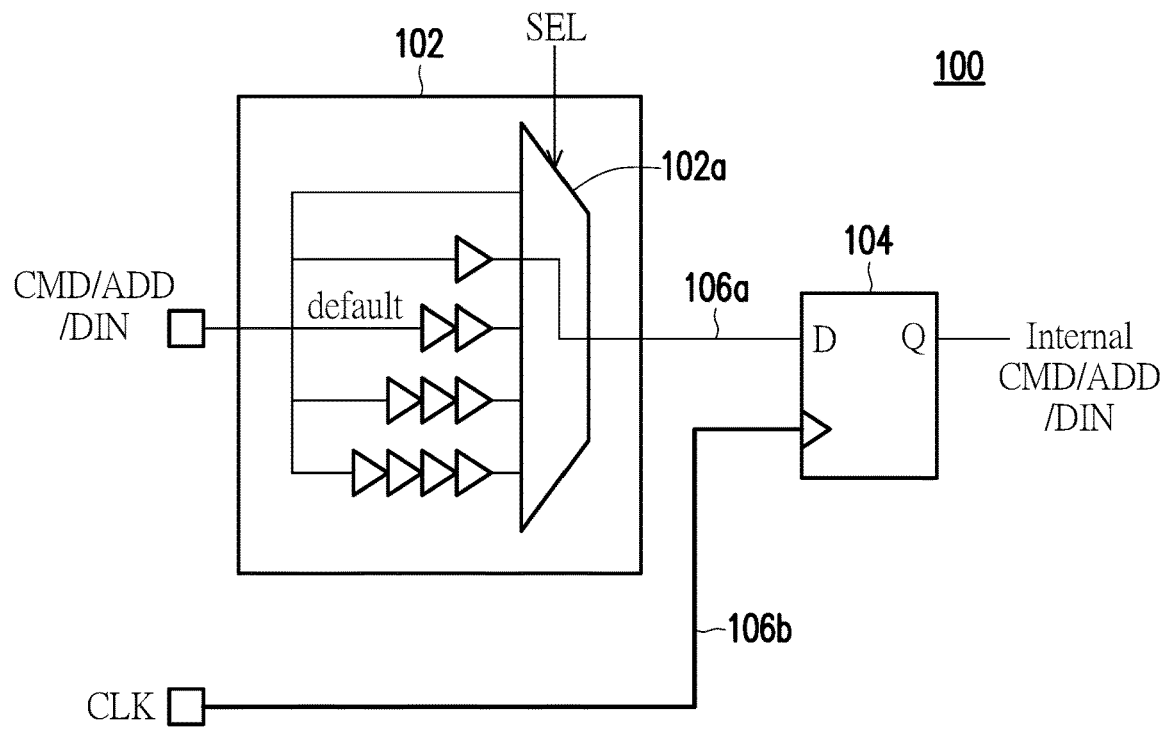
FIGS. 3A and 3B illustrate a timing adjustment device for stacked semiconductor device according to one embodiment of the disclosure.
Figure 3B:
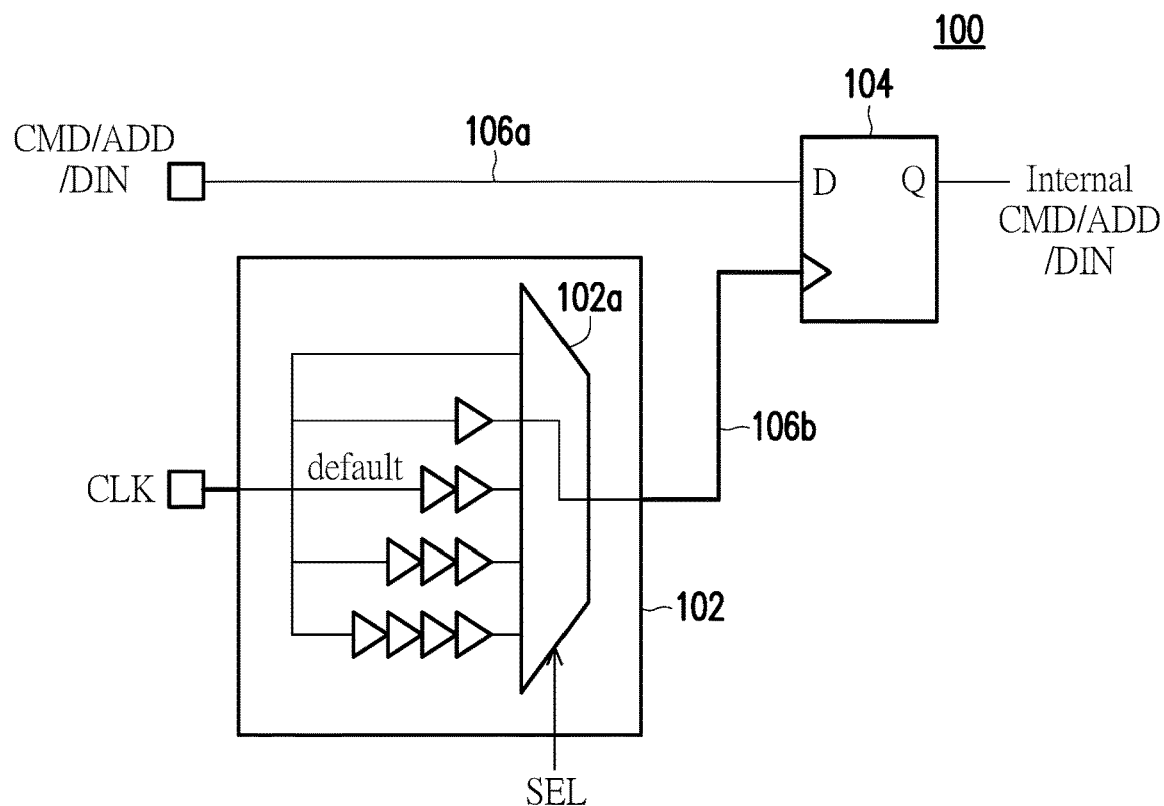

FIGS. 3A and 3B illustrate a timing adjustment device for stacked semiconductor device. The stacked semiconductor device comprises, for example, a logic chip and a memory chip having a plurality of memory tiles. The back side of the memory chip is attached to the logic chip in a face-to-face manner. In the following description, the DRAM chip is used as an example for the memory chip.

Referring to FIG. 2 and FIG. 3A, the timing adjustment device 100 is provided in the input side of each of the DRAM tiles 10, i.e., in a memory control circuit 14 of the DRAM tile 10 and in the data input part of the data input/output circuit 16. The input side means a side where commands CMD (such as command CKE, CS, RAS, CAS, WE defined in the DRAM specification), addresses ADD and data DIN are inputted to the DRAM tile 10.

The timing adjustment device 100 comprises a selector 102 and a flip-flop 104. The flip-flop 104 has a signal input path (or first input) 106*a*, a clock input path (or second input) 106*b* and an output. The selector 102 has a plurality of input paths and an output. The selector 102 is configured to receive an input signal (CMD/ADD/DIN) that may be the command, address and data to be input to the memory array 12. The selector 102 selects one of the input paths in response to a selection signal SEL, so as to output the input signal to the signal input path 106*a* of the flip flop 104. Namely, the output of the selector 102 is coupled to the signal input path 106*a* of the flip-flop 104. The output of the flip-flop 104 is provided to the memory array 12 of the DRAM tile 10. According to one embodiment of the disclosure, the timing adjustment device 100 is provided in the signal input path 106*a* as illustrated in FIG. 3A.

In this embodiment, an example of the flip-flop 104 is a D-type flip-flop that has a first input and a second input respectively receiving the input signal and the clock signal CLK. Another type of flip-flop may be used with suitable modification. In addition, a rising edge triggered flip-flop is used as an example for its operation. However, a falling edge trigger flip-flop may be also used.

In addition, the input paths of the selector 102 provided in the memory control circuit 14 may receive the command CMD, address ADD, and the input paths of the selector 102 provided in the data input part of the data input/output circuit 16 may receive the input data DIN.

In addition, each of the input paths of the selector 102 may provide different delay times for the input signal. For example, in the example shown in FIG. 3A, the selector 102 has five input paths, the first input path is provided with no delay unit, and the second to the fifth unput paths are respectively provided with 1 to 4 delay units, and thus the input signal may be provided to the flip flop 104 with no delay or different delay times (or shift amount) with respect to the edge of the clock signal CLK. In one embodiment, the selection signal SEL is provided from the mode register 14*c*. A mode register set (MRS) command is provided to the selector 102. By selecting one of the input paths of the selector 102, the setup time tIS and the hold time tIH for the command and address and the setup time tDS and the hold time tDH for the input data DIN can be modified. Therefore, the setup/hold times tIS, tHS and tDS, tDH from the logic chip may be changed and the logic chip may choose suitable values for the setup/hold times tIS, tHS and tDS, tDH, so as to facilitate a whole design using M×N DRAM-tiles.

Figure 4A:
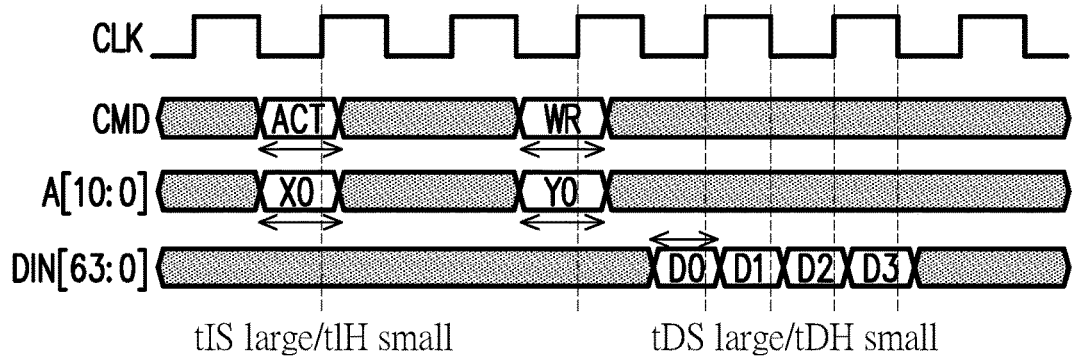
FIGS. 4A and 4B illustrate timing charts for the effects of timing adjustment according to one embodiment of the disclosure.
Figure 4B:
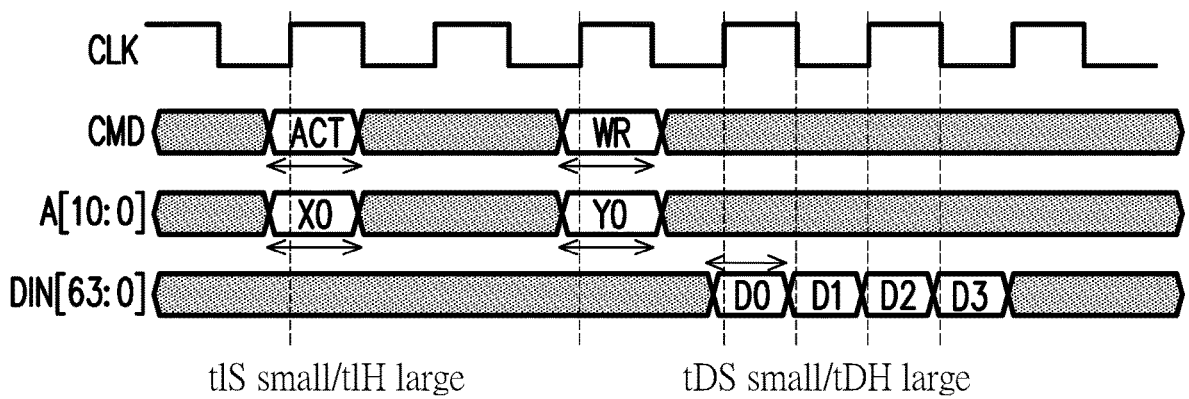

FIGS. 4A and 4B illustrate timing charts for the effects of timing adjustment according to one embodiment of the disclosure. In FIG. 4A, for example, the selector 102 selects a input path with one delay unit, the setup time tIS for the commands ACT, WR and the address A[10:0] (X0, Y0) is large, while the hold time tIH for the command ACT and the address A[10:0] is small. In addition, the setup time tDS for the input data DIN [63:0] (D0, D1, D2, D3, . . . ) is large, while the hold time tIH for the command ACT and the address A[10:0] is small.

In FIG. 4B, for example, the selector 102 selects a input path with three delay unit, the setup time tIS for the commands ACT, WR and the address A[10:0] (X0, Y0) is small, while the hold time tIH for the command ACT, WR and the address A[10:0] (X0, Y0) is large. In addition, the setup time tDS for the input data DIN [63:0] (D0, D1, D2, D3, . . . ) is small, while the hold time tDH for the input data DIN [63:0] (D0, D1, D2, D3, . . . ) is large.

Therefore, by using the timing adjustment device 100, the setup/hold times tIS, tHS and tDS, tDH with respect to the edge of the clock signal CLK may be modified.

According to another embodiment of the disclosure, the timing adjustment device 100 may be provided in the clock input path 106*b* as illustrated in FIG. 3B, so that the rising edge or the falling edge of the clock signal CLK can be shifted. In this manner, the setup/hold times tIS, tHS and tDS, tDH with respect to the edge of the clock signal CLK may also be modified.

Figure 5:
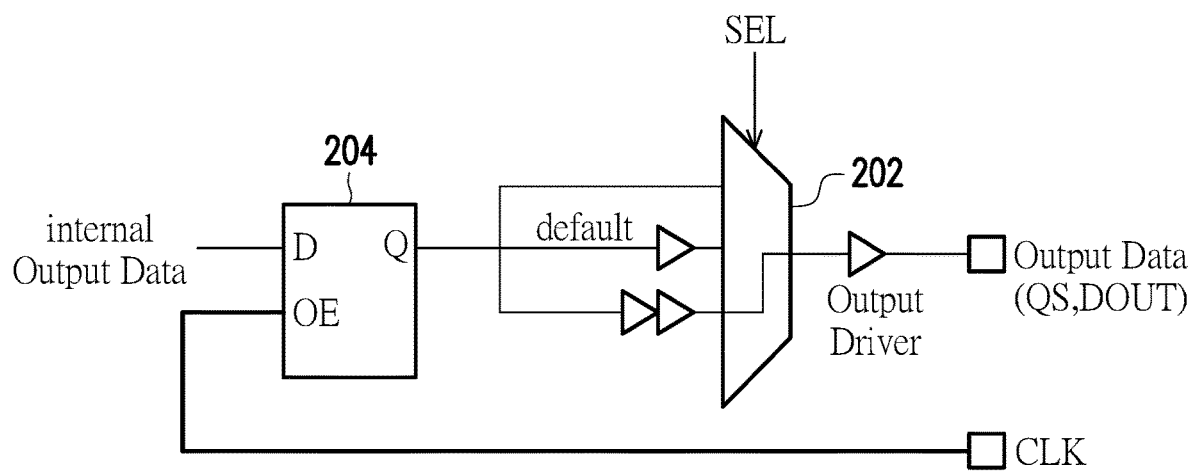
FIG. 5 illustrates another timing adjustment device for stacked semiconductor device according to another embodiment of the disclosure.

FIG. 5 illustrates another timing adjustment device for stacked semiconductor device according to another embodiment of the disclosure. Referring to FIG. 2 and FIG. 5, the timing adjustment device 200 is provided in the output side of each of the DRAM tiles 10, i.e., in the data output part of the data input/output circuit 16 of the DRAM tile 10. The output side means a side where the data stored in the memory array 12 of the DRAM tile 10 is read out.

Similar to the timing adjustment device 100, the timing adjustment device 200 comprises a selector 202 and a flip-flop 204. The flip-flop 204 has a first input (D) for receiving internal output data from the memory array 12 and a second input (OE, output enable) for receiving the clock signal CLK. The selector 202 has a plurality of input paths and an output. The selector 202 is configured to receive the output of the flip flop 204. The selector 102 selects one of the input paths in response to a selection signal SEL, so as to output the output data (QS, DOUT).

In this embodiment, an example of the flip-flop 104 is a D-type flip-flop. Other type flip-flop may be also used with suitable modification. In addition, a rising edge triggered flip-flop is used as an example for its operation. However, a falling edge trigger flip-flop may be also used.

In addition, each of the input paths of the selector 202 may provide different delay times for the output data from the memory array 12. For example, in the example shown in FIG. 5, the selector 202 has three input paths, the first input path is provided with no delay unit, and the second to the third input paths are respectively provided with 1 to 2 delay units, and thus the output data (QS, DOUT) may be output (read) with no delay or different delay times (or shift amount) with respect to the edge of the clock signal CLK. In one embodiment, the selection signal SEL is provided from the mode register 14c. A mode register set (MRS) command is provided to the selector 102. By selecting one of the input paths of the selector 202, the output delay time tQSCK and the skew time tQSQ for the output data QS, DOUT can be modified. Here, the data strobe signal QS is a clock signal and the output data DOUT may be output with respect to the edge of the data strobe signal QS. The output delay time tQSCK is a shift amount with respect to the edge (rising or falling) of the clock signal CLK. The skew time tQSQ for the output data DOUT is a shift amount with respect to the edge of the data strobe signal QS.

Therefore, the output delay time tQSCK and the skew time tQSQ from the logic chip may be changed and the logic chip may choose suitable values for the output delay time tQSCK and the skew time tQSQ, so as to facilitate a whole design using M×N DRAM-tiles.

Figure 6A:
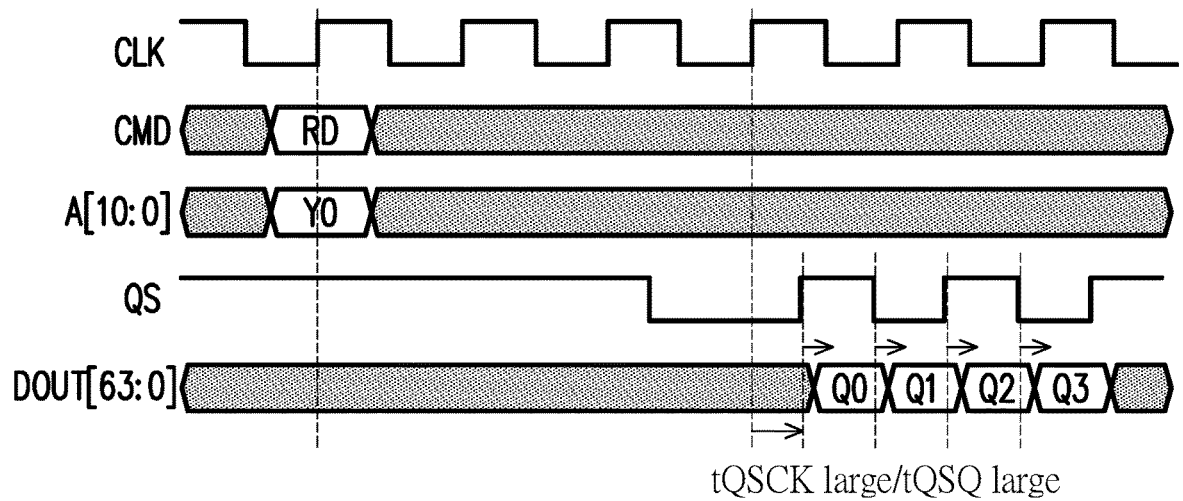
FIGS. 6A and 6B illustrate timing charts for the effects of timing adjustment according to one embodiment of the disclosure.
Figure 6B:
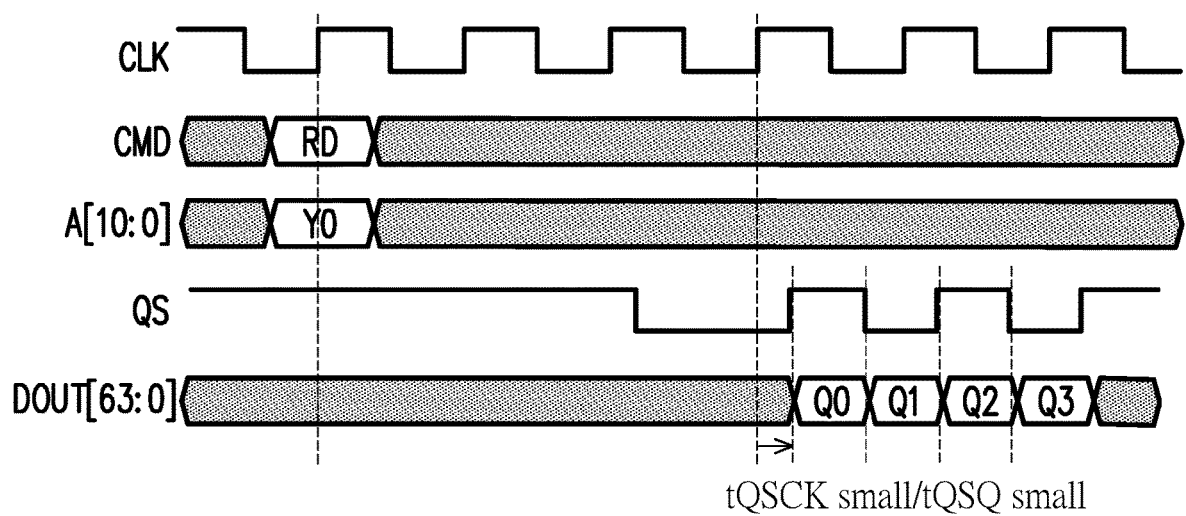

FIGS. 6A and 6B illustrate timing charts for the effects of timing adjustment according to another embodiment of the disclosure. In FIG. 6A, for example, the selector 202 selects a input path with two delay unit, the output delay time tQSCK of the data strobe signal QS with respect to the edge of the clock signal CLK is large, while the skew time tQSQ for data output DOUT [63:0] (Q0, Q1, Q2, Q3, . . . ) is large.

In FIG. 6B, for example, the selector 102 selects a input path with no delay unit, the output delay time tQSCK of the data strobe signal QS with respect to the edge of the clock signal CLK is small, while the skew time tQSQ for data output DOUT [63:0] (Q0, Q1, Q2, Q3, . . . ) is small.

Figure 7:
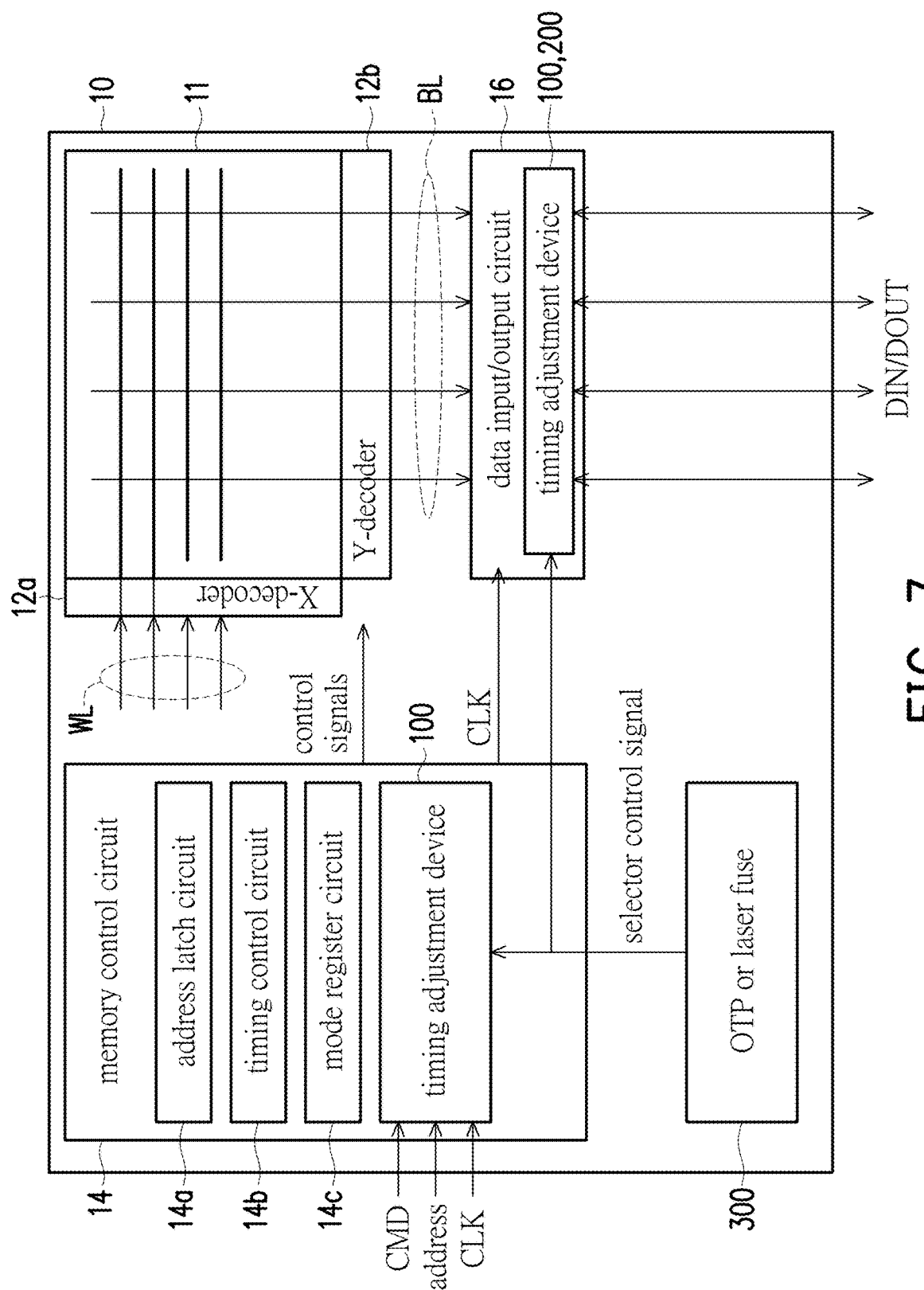
FIG. 7 illustrates a modified timing adjustment device for stacked semiconductor device according to another embodiment of the disclosure.

FIG. 7 illustrates a modified timing adjustment device for stacked semiconductor device according to another embodiment of the disclosure. The configuration illustrated in FIG. 7 is a modified embodiment for the selector 102 in FIGS. 3A-3B and the selector 202 in FIG. 5. As described above, either the selector 102 or the selector 202, the selection is made in response to the selection signal SEL based on the MRS from the mode register circuit 14c.

In FIG. 7, the DRAM tile 10 further comprises a programmable device such as an one-time programmable device (OTP), a laser fuse or the like. In this modification embodiment, the OTP or the laser fuse is used to provide a selector control signal to control the selector 102, 202 to select a input path, so as to modify the setup/hold times tIS/tSH for command, address, the setup/hold times tDS/tDH for input data, or the output delay time/skew time tQSCK/tQSQ for the output data.

Figure 8B:
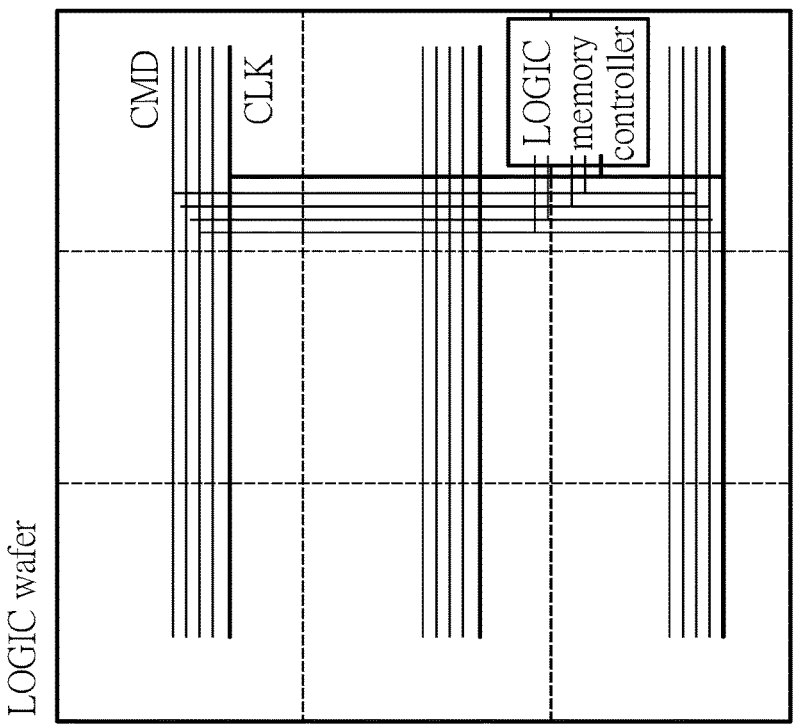
FIGS. 8A, 8B and 8C illustrate a configuration of a stacked memory device with timing adjustment function according to another embodiment of the disclosure.
Figure 8A:
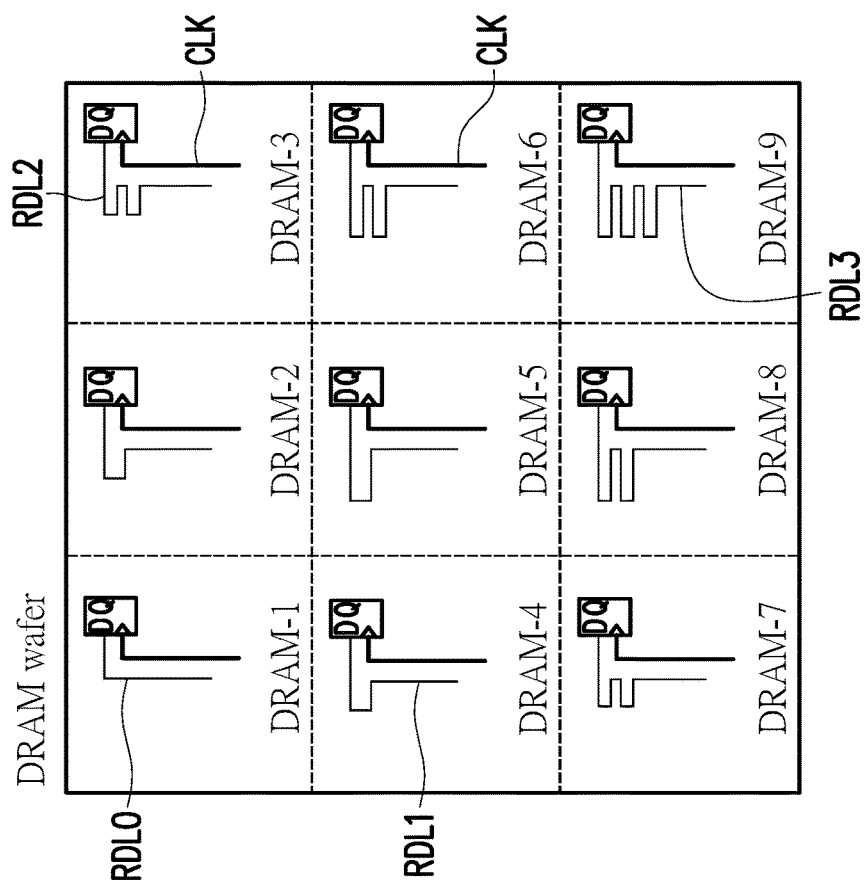
Figure 8C:
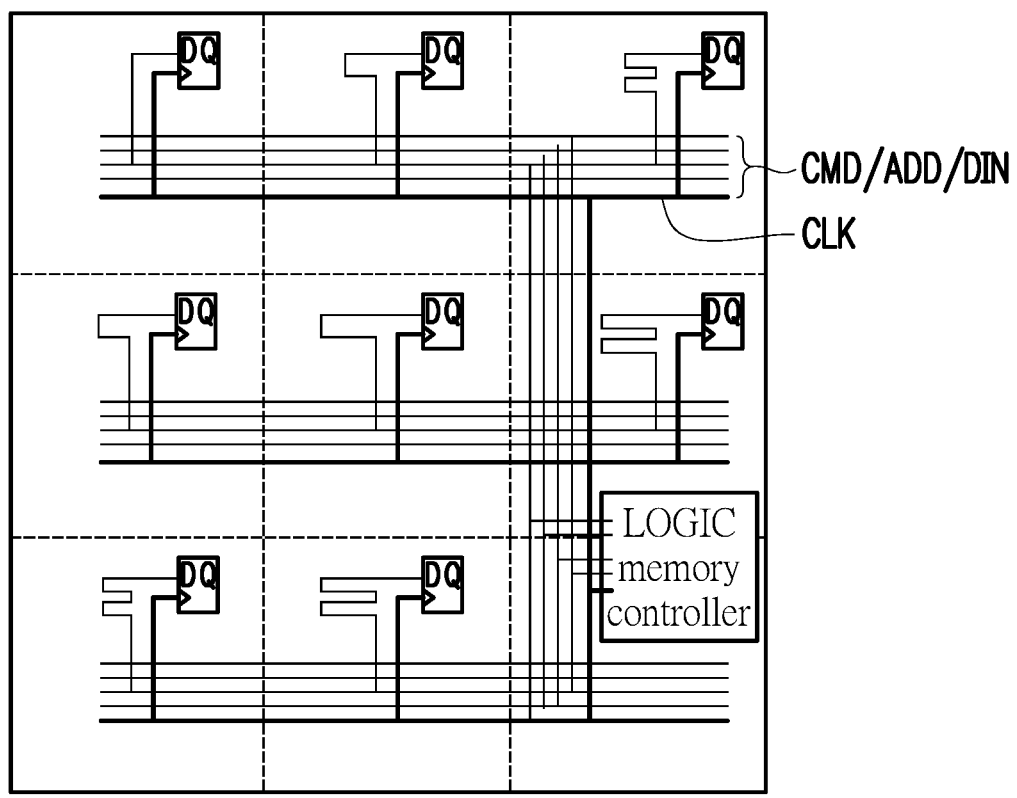

FIGS. 8A, 8B and 8C illustrate a configuration of a stacked memory device with timing adjustment function according to another embodiment of the disclosure. FIG. 8A illustrates an exemplary layout in each DRAM tile of the memory chip, FIG. 8B illustrates an exemplary layout in the logic chip, and FIG. 8C illustrates an exemplary layout after the logic chip is stacked on the memory chip. In this example, one memory chip has 9 DRAM tiles, and the logic chip has one logic memory controller.

In the logic chip, there are a plurality of signal lines and a clock signal line. As described above, the plurality of signal lines is used to provide the command CMD, address ADD and data DIN from the logic memory controller to each of the DRAM tiles DRAM-1~DRAM-9, and the signal lines is used to provide the clock signal CLK from the logic memory controller to each of the DRAM tiles DRAM-1~DRAM-9. The plurality of signal lines and the clock signal lines are arranged at locations corresponding to each DRAM tiles DRAM-1~DRAM-9.

In the memory chip, there are a plurality of RDL (re-distributed line) wiring lines and a clock signal line that are provided in each of the DRAM tiles DRAM-1~DRAM-9 and connected to the inputs of each of the DRAM tiles DRAM-1~DRAM-9. Each RDL wiring line is formed in a back-and-forth pattern, and has different length.

After the logic chip is stacked on the memory chip, each of the plurality of RDL wiring lines in the DRAM tiles DRAM-1~DRAM-9 is connected to the plurality of signal lines in the logic chip, and each of the clock signal lines in the DRAM tiles DRAM-1~DRAM-9 is connected to the clock signal line in the logic chip.

In this configuration, in each of the DRAM tiles DRAM-1~DRAM-9, by the RDL wiring lines with different length from the logic chip to the DRAM tiles, the signal transmission times are different from the logic chip to the DRAM tile. As a result, the setup/hold time tIS, tIH, tDS, tDH for the command CMD, address ADD and data DIN may be shifted with respect to the edge of the clock signal CLK.

For example, when the DRAM tile is locates at a far side from the logic memory controller, the setup time tIS, tDS is large and the hold time tIH, tDH is small. When the DRAM tile is locates at a near side from the logic memory controller, the setup time tIS, tDS is small and the hold time tIH, tDH is large. In this condition, the wiring length of each RDL wiring line is adjusted in a manner that the wiring length of the RDL wiring line in the DRAM tile is short when the DRAM tile is located at the far side from the logic memory controller and the wiring length of the RDL wiring line in the DRAM tile is long when the DRAM tile is located at the near side from the logic memory controller. In addition, if the DRAM tiles have equal distance to the logic memory controller, the wiring lengths of the DRAM tiles may be the same.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A stacked memory with a timing adjustment function, comprising:
    a logic chip;
    a memory chip that is coupled to the logic chip in a face-to-face manner and includes a plurality of memory tiles;
    a plurality of timing adjustment devices, respectively provided in each of the memory tiles, wherein each of the plurality of timing adjustment devices further comprises a first timing adjustment device that is configured to adjust setup times and hold times for a command and an address with respect to an edge of a clock signal and a second timing adjustment device that is configured to adjust a setup time and a hold time for input data with respect to the edge of the clock signal, wherein the first timing adjustment device has a plurality of signal paths with different delay times, and the first timing adjustment device adjusts the setup times and the hold times for the command and the address with respect to the edge of the clock signal by selecting one of the signal paths for passing the command and the address.

2. The stacked memory with a timing adjustment function according to claim 1, wherein the first timing adjustment device is provided in a memory control circuit of each of the plurality of memory tiles and the second timing adjustment device is provided in a data input part of a data input/output circuit of each of the plurality of memory tiles.

3. The stacked memory with a timing adjustment function according to claim 1, wherein each of the first and the second timing adjustment devices further comprises:
   a selector, having an output and a plurality of input paths as the signal paths for receiving the command, the address or the input data, and configured to select one of the input paths in response to a selection signal, wherein the plurality of input paths is configured to respectively provide different shift amounts to adjust the setup times and the hold times for the command and the address and to adjust the setup time and the hold time for the input data; and
   a flip-flop, having a first input that is configured to receive the output of the selector, a second input that is configured to receive the clock signal, and an output configured to output the command, the address or the input data that is shifted with respect to the edge of the clock signal to a memory array of each of the plurality of memory tiles.

4. The stacked memory with a timing adjustment function according to claim 3, wherein the selection signal is set by a command from a mode register of each of the memory tiles, or is set by an one-time programmable device or a laser fuse.

5. The stacked memory with a timing adjustment function according to claim 3, wherein the flip-flop is a D-type flip flop.

6. The stacked memory with a timing adjustment function according to claim 1, wherein the memory chip is a DRAM chip.

* * * * *